United States Patent [19]
Lee

[11] Patent Number: 5,909,860
[45] Date of Patent: Jun. 8, 1999

[54] DEPLOYMENT SEQUENCER

[75] Inventor: Benjamin M. Lee, Monterey Park, Calif.

[73] Assignee: Hughes Electronics Corporation, El Segundo, Calif.

[21] Appl. No.: 09/031,310

[22] Filed: Feb. 26, 1998

[51] Int. Cl.⁶ .................................................. B64G 1/44
[52] U.S. Cl. ........................ 244/173; 136/245; 136/246
[58] Field of Search ........................... 244/173; 136/245, 136/246, 292; 16/221, 71

[56] References Cited

U.S. PATENT DOCUMENTS

| | | | |
|---|---|---|---|
| 5,393,018 | 2/1995 | Roth et al. | 244/173 |
| 5,520,747 | 5/1996 | Marks | 244/173 |
| 5,785,280 | 7/1998 | Baghdasarian | 244/173 |
| 5,810,296 | 9/1998 | Izumi | 244/173 |

*Primary Examiner*—J. Woodrow Eldred
*Attorney, Agent, or Firm*—Georgann S. Grunebach; M. W. Sales

[57] ABSTRACT

In order to control the deployment of secondary deployment structures in a deployment system that includes both a primary and a secondary deployment, an improved deployment sequencer utilizes the rotational motion of primary deployment structures. In particular, the rotational motion serves to control the retention and release of the secondary deployment structures during the primary deployment. Still more specifically, the deployment sequencer restrains the deployment of the secondary deployment structures until the primary deployment structures have deployed or rotated far enough so that collisions between the secondary deployment structures are avoided.

13 Claims, 4 Drawing Sheets

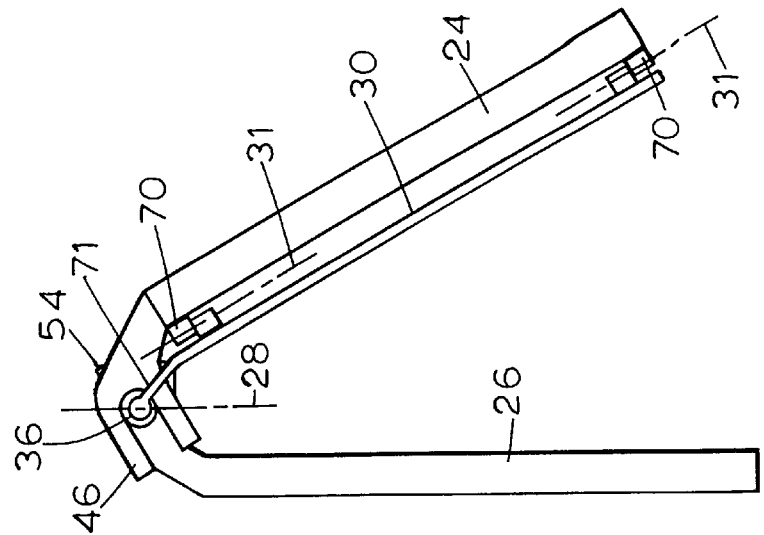
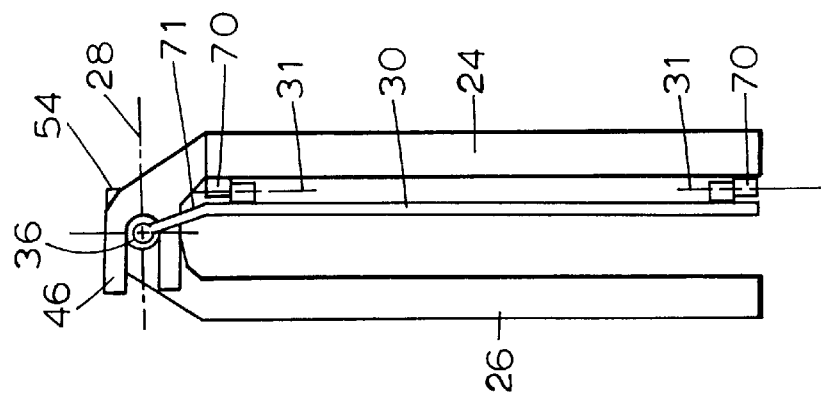
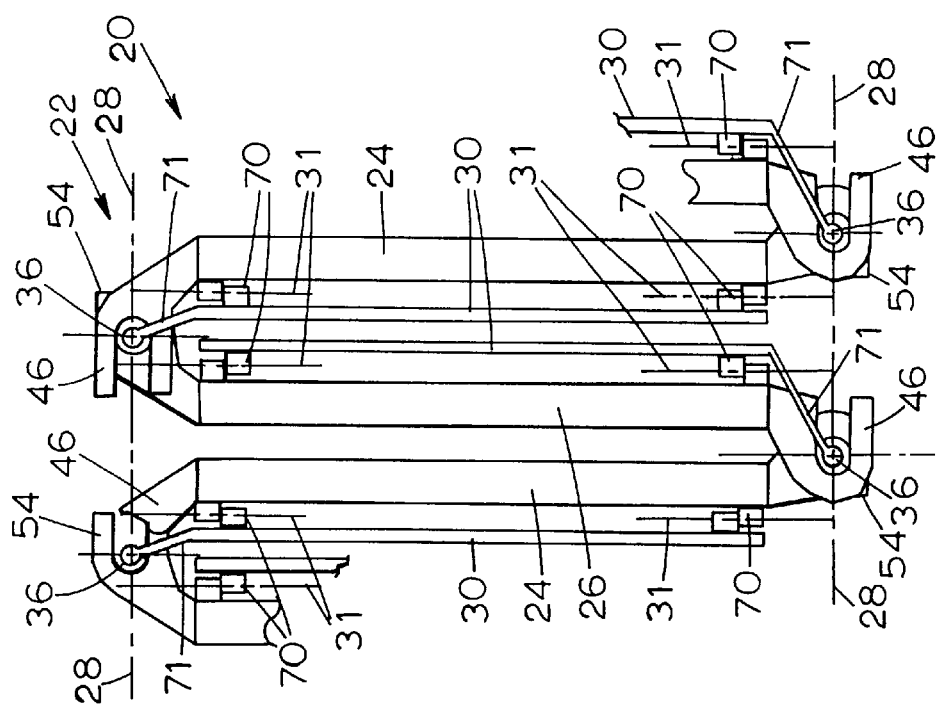

DEPLOYMENT SEQUENCER

BACKGROUND OF THE INVENTION

1. Field of the Invention

The present invention relates generally to spacecraft deployment systems and, more particularly, to a deployment sequencer for controlling the deployment of a secondary structure.

2. Description of the Related Art

When a satellite is launched on a spacecraft, the external equipment of the satellite is stowed in a retracted position to conserve space and to avoid damage to the equipment. Once the satellite is in orbit, stowed equipment is deployed from the satellite to an operative position. Some of the equipment is designed to deploy in multiple stages to facilitate more compact stowage on the spacecraft. One example of a piece of equipment with multiple deployment stages is a solar panel array including reflector panels.

In a solar panel array, the solar panels are pivotally coupled end-to-end and folded accordion style for stowage. Each of the solar panels has a pair of reflectors, each pivotally coupled to an edge that is not coupled to an adjacent solar panel. To store the solar panel array, the reflector panels are folded over their associated solar panel, and the solar panels are folded accordion style into a panel stack. Once the satellite is in orbit, the components are unfolded in reverse order to deploy the solar panel array.

During the primary deployment of the solar panel array, the solar panels are unfolded away from the spacecraft until the panels are in substantially planar alignment. At this point, the solar panels have deployed far enough that the reflector panels coupled to one of the solar panels will not collide with the reflector panels coupled to the adjacent solar panel as the reflector panels are rotated into position during the secondary deployment. The secondary deployment stage is triggered by the release of the reflector panels from the stowed position and is completed when the reflector panels have rotated into their deployed position.

A basic two-stage mechanical deployment system, such as that described above, uses a trigger placed near the end of the path of travel of the equipment during primary deployment to operate a lever system that unlatches and starts the secondary deployment. The trigger is spring loaded so as to require the application of an activation force by a main deployment spring in order to cause the lever system to operate. Due to variations in tolerances and assembly, the activation force can vary significantly. The trigger cannot be so sensitive that it can accidentally cause the lever system to operate. Conversely, the trigger cannot be so stiff that the main deployment spring has difficulty applying a sufficient activation force. The main deployment spring must therefore be sized such that it can provide an activation force sufficient to overcome the spring loading of the trigger while providing a margin for safety. However, an oversized deployment spring stores excessive energy that is difficult to control and causes excessive strain on other parts of the system. Further, the placement of the trigger near the end of the path of travel of the equipment during primary deployment results in the activation force of the main deployment spring being at a minimum.

One alternative method of triggering the deployment of the reflector panels is to use an electronic, pyrotechnic or thermal actuator. Once the solar panels are deployed, a signal is transmitted from the satellite to the actuator to trigger the release of the reflector panels. Although these types of actuators can be effective for triggering the release of the reflector panels, the actuators add weight to the solar panel array, thereby increasing the size of the spring necessary to deploy the solar panel. In addition, this alternative requires additional slip-rings on the solar wing drive to transmit power across the joint to the actuator. Moreover, the actuators and additional slip-rings introduce additional failure modes into the system which ultimately reduce the system reliability.

Another alternative for deploying the reflectors is to link the corners of the reflector panels together with lanyards. In this alternative, the lanyards interlock the reflector panels in a semi-closed position until the solar panels are almost fully deployed, and the reflector hinge lines are linearly aligned. Although this alternative is simple and lightweight, the lanyards allow some relative movement of the reflector panels and, therefore, do no eliminate collisions between the reflectors panels.

In yet another alternative triggering method, a trigger is used near the deployment stop of the main hinge. When the main hinge has deployed and is near the deployment stop, the trigger is activated and a system of springs and levers release a latch which deploys the reflector panels. As with the use of actuators, this method adds complexity to the system, increase the weight of the satellite and the solar panel array, and reduces the reliability of the deployment system. Additionally, the pull of the trigger takes away from the torque available from the main spring at the end of deployment when the torque is at a minimum.

Therefore, there is a need for an improved deployment sequencer for triggering a secondary deployment stage without significantly increasing the weight of the satellite and the deployed equipment, significantly increasing the power required to complete deployment, or significantly reducing the reliability of the deployment system.

SUMMARY OF THE INVENTION

The present invention is directed to an improved deployment sequencer for controlling the deployment of secondary deployment structures in a deployment system that includes both a primary and a secondary deployment. The sequencer incorporates the rotational motion of the primary deployment structures to control the retention and release of the secondary deployment structures during the primary deployment. The sequencer restrains the deployment of the secondary structure until the primary structure has deployed or rotated far enough so that collisions between the secondary structures are avoided.

According to one aspect of the present invention, a deployment sequencer is provided for controlling the deployment of a first reflector panel on a solar panel array. A first solar panel on the array is pivotally coupled to a second solar panel with a primary deployment hinge line about which the first and the second solar panels pivot between a solar panel stowed position and a solar panel deployed position. The first reflector panel is coupled to one of the first and the second solar panels and is adapted to move between a reflector panel stowed position and a reflector panel deployed position.

The deployment sequencer includes a first forked member mounted on the first solar panel, a second forked member mounted on the second solar panel, and a retention member coupled to the first reflector panel. The second forked member is oriented in opposing relationship with the first forked member when the first and the second solar panels are in the solar panel stowed position, and the second forked member is aligned with the first forked member when the first solar panel is in the solar panel deployed position. The retention member is captivated by the first and the second forked members when the first and the second forked members are oriented in opposing relationship, and is released by the first and the second forked members when the first and the second forked members are aligned. Configured in this way, the first reflector panel is retained in the reflector panel stowed position until the first and the second solar panels pivot to approximately the solar panel deployed position.

In one embodiment of the present invention, the first reflector panel is pivotally coupled to the one of the first and the second solar panels and has a secondary deployment hinge line about which the first reflector panel pivots between the reflector panel stowed position and the reflector panel deployed position. The retention member may be coupled to the first reflector panel by a lanyard, a rigid member, or any other coupling element so that the first reflector panel is retained in the stowed position until the retention member is released by the forked members. Additionally, the solar panel array may include a second reflector panel coupled to the other of the first and the second solar panels and to the retention member. Arranged in this way, the second reflector panel is deployed along with the first reflector panel under the control of the deployment sequencer. Moreover, the deployment sequencer may include a resilient member that biases the retention member away from the forked members to overcome any friction or interference that may cause the retention member to be captivated by the aligned forked members.

According to another aspect of the present invention, a deployment sequencer is provided for controlling the deployment of a first secondary deployment structure in multiple deployment stage equipment. A first primary deployment structure is pivotally coupled to a second primary deployment structure with a primary deployment hinge line about which the first and the second primary deployment structures pivot between a primary stowed position and a primary deployed position. The first secondary deployment structure is coupled to one of the first and the second primary deployment structures and is adapted to move between a secondary stowed position and a secondary deployed position.

The deployment sequencer includes a first sequencing member mounted on the first primary deployment structure, a second sequencing member mounted on the second primary deployment structure, and a retention member coupled to the first secondary deployment structure. The first and the second sequencing members are adapted to captivate the retention member when the first and the second primary deployment structures are in the primary stowed position, and are adapted to release the retention member when the primary deployment structures are in the primary deployed position. Arranged in this way, the first secondary deployment structure is retained in the secondary stowed position until the first and the second primary deployment structures pivot to approximately the primary deployed position.

In one embodiment of the present invention, the first and the second sequencing members have forked portions that are oriented in opposing relationship with the retention member disposed therebetween when the primary deployment structures are in the primary stowed position, and aligned when the primary deployment structures are in the primary deployed position. In another embodiment of the present invention, the first secondary deployment structure is pivotally coupled to the one of the first and the second primary deployment structures and has a secondary deployment hinge line about which the first secondary deployment structure pivots between the secondary stowed position and the secondary deployed position.

The retention member may be coupled to the first secondary deployment structure by a lanyard, a rigid member, or any other coupling element so that the first secondary deployment structure is retained in the stowed position until the retention member is released by the sequencing members. Additionally, the multiple deployment stage equipment may include a second secondary deployment structure coupled to the other of the first and the second primary deployment structures and to the retention member. Arranged in this way, the second secondary deployment structure is deployed along with the first primary deployment structure under the control of the deployment sequencer. Moreover, the deployment sequencer may include a resilient member that biases the retention member away from the sequencing members to overcome any friction or interference that may cause the retention member to be captivated by the sequencing members when the primary deployment structures are in the deployed position.

The features and advantages of the invention will be apparent to those of ordinary skill in the art in view of the detailed description of the preferred embodiments, which is made with reference to the drawings, a brief description of which is provided below.

BRIEF DESCRIPTION OF THE DRAWINGS

FIGS. 8(a)–(f) are a series of side elevational views of the deployment of a solar panel array implementing the deployment sequencer of FIG. 2.

DETAILED DESCRIPTION OF THE PREFERRED EMBODIMENTS

Figure 1A:
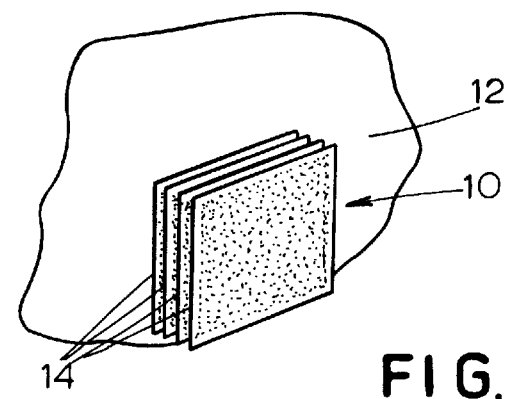
FIGS. 1(a)–(e) are schematic views of the primary and secondary deployment of a solar panel array and the associated reflector panels.
Figure 1B:
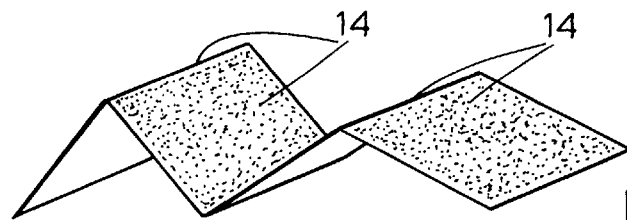
Figure 1C:
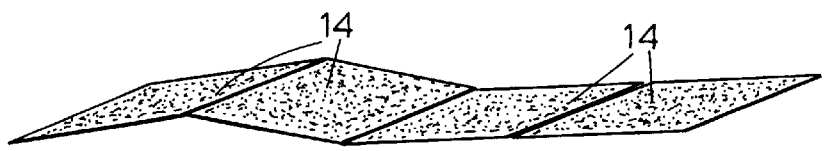
Figure 1D:
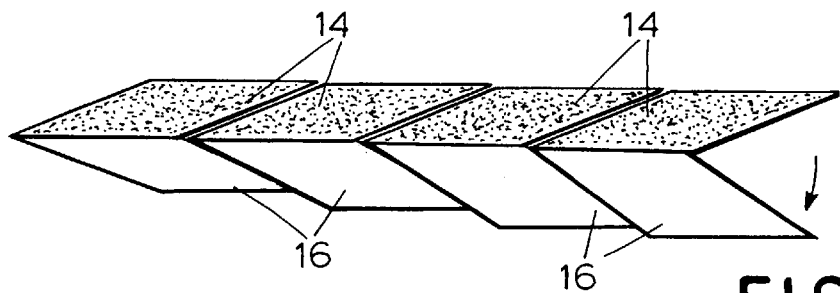
Figure 1E:
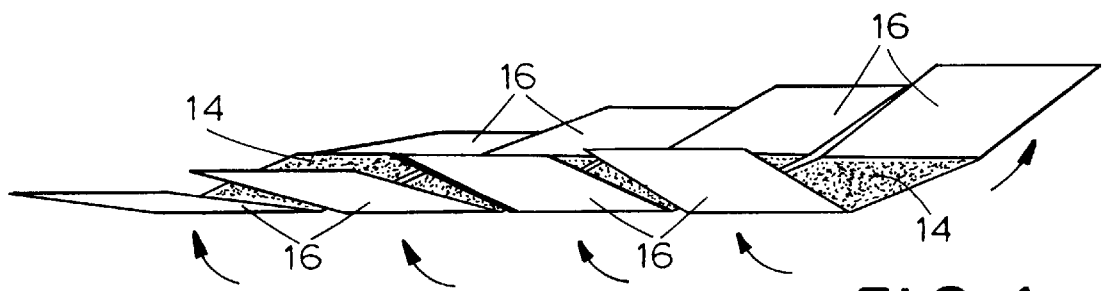

FIGS. 1(a)–(e) illustrate schematically one example of a piece of satellite equipment with a primary deployment followed by a secondary deployment. A solar panel array 10 is stowed as a panel stack on the side of a satellite 12 (FIG. 1(a)). During primary deployment, the solar panels 14 are released from the spacecraft 12, thereby allowing the panel stack of solar panels 14 to unfold away from the spacecraft 12 (FIG. 1(b)). The primary deployment continues until the solar panels 14 are substantially aligned (FIG. 1(c)). At this point, a plurality of reflector panels 16, which are pivotally coupled to the solar panels 14, are caused to pivot away from the solar panels 14, thereby beginning the secondary deployment stage (FIG. 1(d)). The secondary deployment continues until the reflector panels 16 rotate to their predetermined deployed position (FIG. 1(e)). The improved deployment sequencer according to the present invention is illustrated in FIGS. 2–8.

Figure 2:
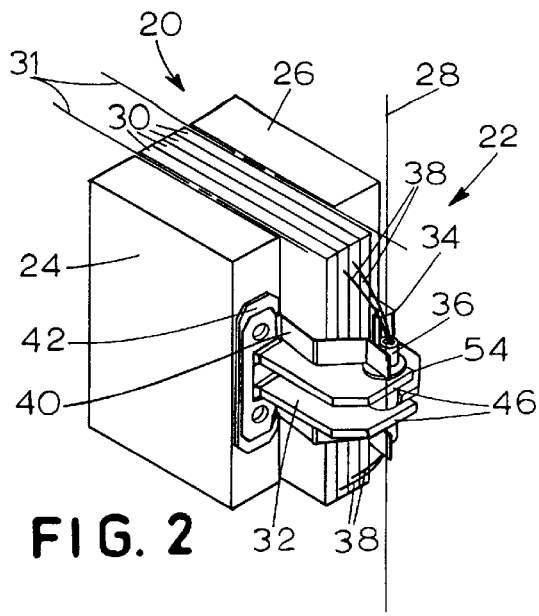
FIG. 2 is an isometric view of a deployment sequencer according to the present invention in the stowed position.

Referring to FIG. 2, a stowed solar panel array 20 includes a deployment sequencer 22 according to the present invention. The panel array 20 includes, among other components, first and second solar panels 24, 26 pivotally connected and having a primary deployment hinge line 28 provided by a hinge (not shown) and about which the solar panels 24, 26 pivot during the primary deployment. Each of the solar panels 24, 26 has a pair of reflector panels 30 pivotally connected thereto on opposite edges and having secondary hinge lines 31 provided by hinges (not shown) such that the panel array 20 is deployed in the manner illustrated in FIGS. 1(a)–(e) and described in the associated text. The deployment sequencer 22 includes a female hinge member 32 mounted on the first solar panel 24 and a male hinge member 34 mounted on the second solar panel 26. The deployment sequencer 22 further includes a pin 36 coupled at both ends by tethers 38 to two of the reflector panels 30 that will be disposed on the same side of the panel array 20 when the panel array 20 is deployed. In the stowed position, the pin 36 is captivated by the male and female hinge members 32, 34 in a manner that is described more fully below. The deployment sequencer 22 may further include a spring member 40 mounted on one of the solar panels 24, 26 that facilitates the release of the pin 36 at the onset of the secondary deployment.

Figure 3:
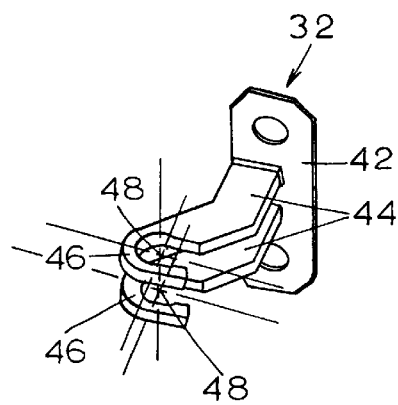
FIG. 3 is an isometric view of a female hinge member of the deployment sequencer of FIG. 2.

Referring to FIG. 3, the female hinge member 32 is shown in greater detail. The female hinge member 32 has a base 42 with a pair of arms 44 extending therefrom. The arms 44 extend outwardly from the base 42 for a distance and terminate at fork ends 46. The fork ends 46 have an arched internal surface with a centerpoint 48. The base 42 is mounted to the solar panel 24 with the arms 44 extending outwardly from the solar panel 24.

Figure 4:
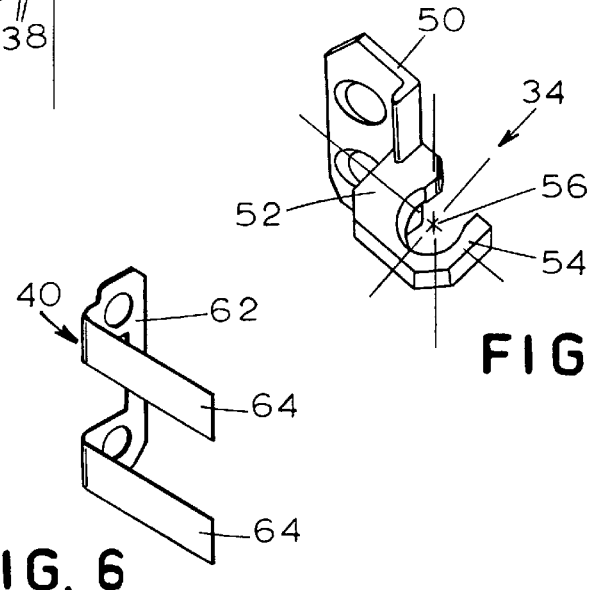
FIG. 4 is an isometric view of a male hinge member of the deployment sequencer of FIG. 2.

The male hinge member 34 of the deployment sequencer 22 is illustrated in FIG. 4. The male hinge member 34 has a base 50 with an arm 52 extending outwardly from the base 50 and terminating at a forked end 54. The forked end 54 has an arched internal surface with a centerpoint 56. The base 50 is mounted to the solar panel 26 with the arm 52 extending outwardly from the solar panel 26.

Figure 5:
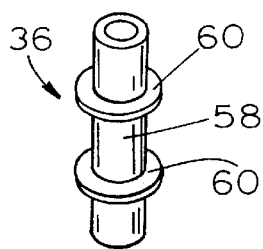
FIG. 5 is an isometric view of a pin of the deployment sequencer of FIG. 2.
Figure 6:
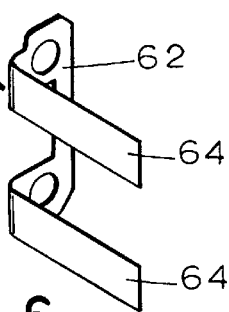
FIG. 6 is an isometric view of a spring member of the deployment sequencer of FIG. 2.

FIG. 5 illustrates the pin 36 in greater detail. The pin 36 has a tubular portion 58 with a pair of flanges 60 extending radially outward from the surface of the tubular portion 58. The spring member 40, as shown in FIG. 6, may also be included in the deployment sequencer 22. The spring member 40 is fabricated from a resilient material and includes a base 62 having a pair of arms 64 in the form of leaf springs extending outwardly therefrom.

Returning to FIG. 2, the female hinge member 32 and the male hinge member 34 are mounted to the edges of the panels 24, 26, respectively, with the arms 44, 52 extending outwardly. The female and the male hinge members 32, 34 are mounted with the forked end 54 disposed between the forked ends 46. The forked ends 46, 54 are oriented so that the centerpoints 48, 56 are approximately coincident with the primary deployment hinge line 28 such that the centerpoints 48, 56 remain approximately coincident with the primary deployment hinge line 28. The arched surfaces pivot about the primary deployment hinge line 28 as the panels 24, 26 rotate about the primary deployment hinge line 28 between the stowed and the primary deployment positions.

The pin 36 is dimensioned to fit within the forked ends 46, 54 so that the arched surfaces can pivot about the primary deployment hinge line 28 without binding up as the panels 24, 26 rotate between the stowed and primary deployment positions. The female and the male hinge members 32, 34 are oriented such that the forked ends 46, 54 face in opposite directions when the panels 24, 26 are in the stowed position. Oriented in this way, the pin 36 is retained within the forked ends 46, 54 in the stowed position. The flanges 60 are positioned on the exterior surface of the pin 36 so that the flanges 60 are disposed on the sides of the forked ends 46 opposite the forked end 54, thereby preventing substantial linear movement of the pin 36 along the primary deployment hinge line 28. The lanyards 38 couple the pin 36 to the reflector panels 30 to prevent the reflector panels 30 from deploying while the pin is disposed within the forked ends 46, 54. At the same time, the lanyards 38 allow some movement of the pin 36 off of the primary deployment hinge line 28 along with the forked ends 46, 54 if the female and male hinge members 32, 34 are slightly misaligned. Alternatively, the pin 36 could be rigidly connected to the reflector panels 30 if sufficient clearance is provided between the pin 36 and the interior surfaces of the forked ends 46, 54 to allow the forked ends 46, 54 to move off the primary deployment hinge line 28 without becoming bound up on the pin 36.

The spring member 40 is mounted to one of the female and the male hinge members 32, 34 with the arms 64 extending outwardly. The arms 64 are oriented so that they are engaged by the pin 36 when the pin 36 is disposed within the forked ends 46, 54. The engagement by the pin 36 causes the arms 64 to deflect slightly and, consequently, to exert a force on the pin 36.

Figure 7:
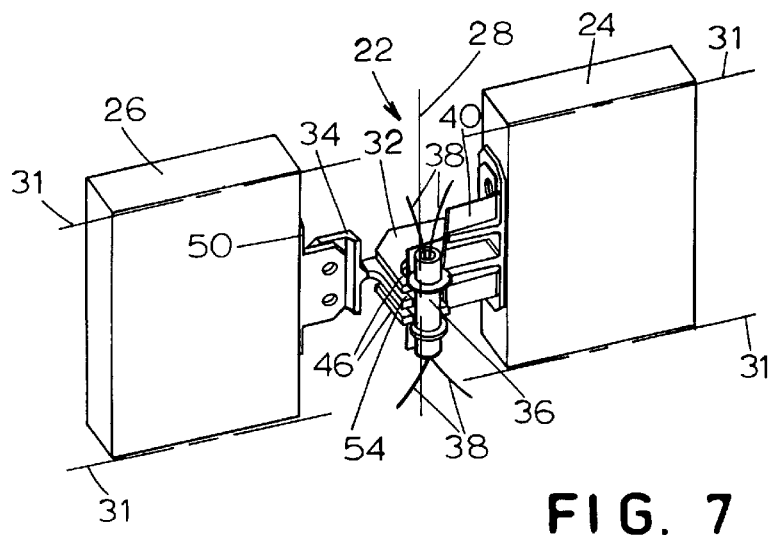
FIG. 7 is an isometric view of the deployment sequencer of FIG. 2 at the onset of the secondary deployment.

FIG. 7 illustrates the array 20 of FIG. 2 at the onset of the secondary deployment of the reflector panels 30. The reflector panels 30 have been removed and the view has been rotated for the sake of clarity. As shown, the panels 24, 26 have rotated about the primary deployment hinge line 28 under the urging of the primary deployment spring (not shown) and are substantially parallel. At this point, the forked ends 46, 54 are substantially aligned and the pin 36 may be pulled out of the forked ends 46, 54. As the panels 24, 26 approach the deployed position, the forked ends 46, 54 come into alignment after the panels 24, 26 are deployed far enough so that the reflector panels 30 can begin deploying about the secondary deployment hinge lines 31 with sufficient clearance that they may deploy without hitting each other. Once the forked ends 46, 54 are aligned, the tension in the secondary deployment springs (not shown) forces the rotation of the reflector panels 30, thereby pulling the pin 36 out of the forked ends 46, 54 by reason of the connection of the reflector panels 30 to the pin 36 through the tethers 38. If necessary, the spring member 40 provides additional force to overcome friction or interference due to a slight misalignment of the forked ends 46, 54. Once the pin 36 is clear of the forked ends 46, 54, the panels 30 are free to rotate about the secondary deployment hinge lines 31 toward their deployed positions.

FIGS. 8(a)–(f) illustrate schematically the sequence of deployment of the array 20 from the stowed position to the onset of the secondary deployment. In FIGS. 8(a)–(f), the reflector panels 30 are connected to the solar panels 24, 26 by hinge connections 70 having axes of rotation that form the secondary deployment hinge lines 31. Each of the solar panels 24, 26 has a deployment sequencer 22 disposed at either end to control the secondary deployment of both reflector panels 30 coupled thereto. Moreover, in this embodiment, the pins 36 are coupled to the reflector panels 30 by rigid connection members 71. Attached in this way, the rigid connection members 71 prevent linear movement of the pins 36 along the primary deployment hinge lines 28. However, the connection members 71 are less forgiving than the lanyards 38 discussed above when the centerpoints 48, 56 of the forked ends 46, 54 are not substantially aligned with the primary deployment hinge lines 28 throughout the rotation of the solar panels 24, 26 during primary deployment. The risk of interference and, consequently, binding is minimized, however, by providing sufficient clearance between the pins 36 and the internal surfaces of the forked ends 46, 54 to allow for misalignment of the forked ends 46, 54.

Figure 8F:
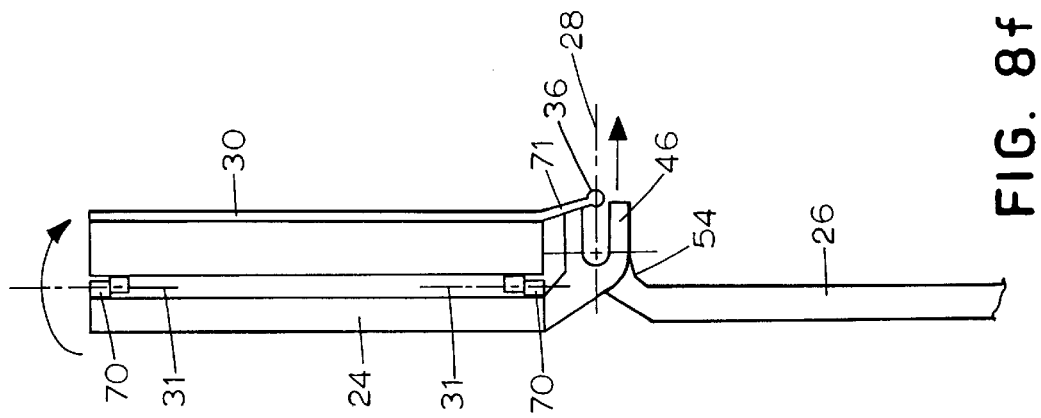
Figure 8E:
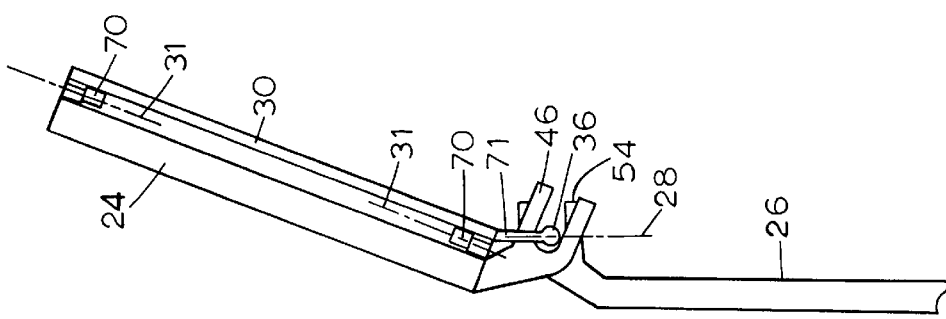
Figure 8D:
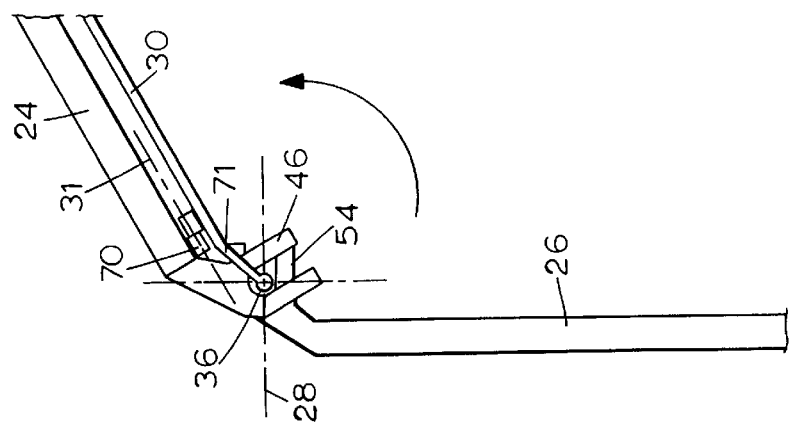

As discussed previously, when the solar panel array 20 is in the stowed position shown in FIGS. 8(a) and (b), the pins 36 are disposed within the forked ends 46, 54 of the female and male hinge members 32, 34, respectively. In the stowed position, the forked ends 46, 54 face in opposite directions, thereby surrounding and captivating the pins 36 to control the secondary deployment of the reflector panels 30. While captivated by the forked ends 46, 54, the pins 36 are aligned substantially along the primary deployment hinge lines 28 of the associated solar panels 24, 26. As the solar panels 24, 26 rotate about the primary deployment hinge lines 28, the forked ends 46, 54 also rotate about the primary deployment hinge lines 28 (FIGS. 8(c) and (d)). The forked ends 46, 54 remain in interfering relationship, thereby retaining the pin 36, until the panels 24, 26 rotate to a release point wherein the forked ends 46, 54 are nearly aligned (FIG. 8(e)). As the forked ends 46, 54 come into full alignment at the end of the primary development (FIG. 8(f)), the pin 36 is in a position to be released by the forked ends 46, 54 and the reflector panel 30 is free to rotate about the secondary deployment hinge line 70 under the influence of the secondary deployment spring (not shown) to cause the pin 36 to be released from the forked ends 46, 54 due to the coupling of the pin 36 to the reflector panel 30 through the rigid connection member 71.

While the present invention has been described with reference to the specific examples, which are intended to be illustrative only and not to be limiting of the invention, it will be apparent to those of ordinary skill in the art that changes, additions, and/or deletions may be made to the disclosed embodiment without departing from the spirit and scope of the invention.

What is claimed is:

1. A deployment sequencer for controlling the deployment of a first reflector panel on a solar panel array, wherein a first solar panel is pivotally coupled to a second solar panel with a primary deployment hinge line about which said first and said second solar panels pivot between a solar panel stowed position and a solar panel deployed position, and wherein said first reflector panel is coupled to one of said first and said second solar panels and is adapted to move between a reflector panel stowed position and a reflector panel deployed position, said deployment sequencer comprising:

a first forked member mounted on said first solar panel;

a second forked member mounted on said second solar panel, said second forked member oriented in opposing relationship with said first forked member when said first and said second solar panels are in said solar panel stowed position and aligned with said first forked member when said first solar panel is in said solar panel deployed position; and a retention member coupled to said first reflector panel, said retention member being captivated by said first and said second forked members when said first and said second forked members are oriented in opposing relationship, and being uncaptivated by said first and said second forked members when said first and said second forked members are aligned, whereby said first reflector panel is retained in said reflector panel stowed position until said first and said second solar panels pivot to approximately said solar panel deployed position.

2. The deployment sequencer according to claim 1, wherein said first reflector panel is pivotally connected to said one of said first and said second solar panels and has a secondary deployment hinge line about which said first reflector panel pivots between said reflector panel stowed position and said reflector panel deployed position.

3. The deployment sequencer according to claim 1, wherein said retention member is coupled to said first reflector panel by a lanyard.

4. The deployment sequencer according to claim 1, wherein said retention member is coupled to said first reflector panel by a rigid member.

5. The deployment sequencer according to claim 1, wherein said solar panel array includes a second reflector panel coupled to the other of said first and said second solar panels and to said retention member and adapted to move between said reflector stowed position and said reflector deployed position.

6. The deployment sequencer according to claim 1, further comprising a resilient member coupled to one of said first and said second solar panels and adapted to bias said retention member away from said first and said second forked members when said first and said second forked members are aligned.

7. A deployment sequencer for controlling the deployment of a first secondary deployment structure in multiple deployment stage equipment, wherein a first primary deployment structure is pivotally coupled to a second primary deployment structure with a primary deployment hinge line about which said first and said second primary deployment structures pivot between a primary stowed position and a primary deployed position, and wherein said first secondary deployment structure is coupled to one of said first and said second primary deployment structures and is adapted to move between a secondary stowed position and a secondary deployed position, said deployment sequencer comprising:

a first sequencing member mounted on said first primary deployment structure;

a second sequencing member mounted on said second primary deployment structure; and a retention member coupled to said first secondary deployment structure, said first and said second sequencing members being adapted to captivate said retention member when said first and said second primary deployment structures are in said primary stowed position, and being adapted to uncaptivate said retention member when said first and said second primary deployment structures are in said primary deployed position, whereby said first secondary deployment structure is retained in said secondary stowed position until said first and said second primary deployment structures pivot to approximately said primary deployed position.

8. The deployment sequencer according to claim 7, wherein said first sequencing member has a first forked portion and said second sequencing member has a second forked portion, said first and said second forked portions being oriented in opposing relationship with said retention member disposed therebetween when said first and said second primary deployment structures are in said primary stowed position, and being aligned when said first and said second primary deployment structures are in said primary deployed position.

9. The deployment sequencer according to claim 7, wherein said first secondary deployment structure is pivotally connected to said one of said first and said second primary deployment structures and has a secondary deployment hinge line about which said first secondary deployment structure pivots between said secondary stowed position and said secondary deployed position.

10. The deployment sequencer according to claim 7, wherein said retention member is coupled to said first secondary deployment structure by a lanyard.

11. The deployment sequencer according to claim 7, wherein said retention member is coupled to said first secondary deployment structure by a rigid member.

12. The deployment sequencer according to claim 7, wherein said multiple deployment stage equipment has a second secondary deployment structure coupled to the other of said first and said second primary deployment structures and to said retention member and adapted to move between said secondary stowed position and said secondary deployed position.

13. The deployment sequencer according to claim 7, further comprising a resilient member coupled to one of said first and said second primary deployment structures and adapted to bias said retention member away from said first and said second sequencing members when said first and said second primary deployment structures are in said primary deployed position.

* * * * *